(12) United States Patent
Ibok

(10) Patent No.: US 6,800,568 B1
(45) Date of Patent: Oct. 5, 2004

(54) METHODS FOR THE DEPOSITION OF HIGH-K FILMS AND HIGH-K FILMS PRODUCED THEREBY

(75) Inventor: Effiong Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/189,133

(22) Filed: Jul. 2, 2002

(51) Int. Cl.$^7$ .............................................. H01L 21/31
(52) U.S. Cl. ...................................... 438/778; 438/197
(58) Field of Search .......................................... 438/778

(56) References Cited

U.S. PATENT DOCUMENTS

| | | | |
|---|---|---|---|
| 5,728,222 A | 3/1998 | Barbee et al. | 118/715 |
| 6,296,711 B1 * | 10/2001 | Loan et al. | 118/726 |

FOREIGN PATENT DOCUMENTS

| | | |
|---|---|---|
| WO | WO 98/23787 | 6/1998 |
| WO | WO 98/58096 | 12/1998 |
| WO | WO 00/59023 | 10/2000 |

\* cited by examiner

*Primary Examiner*—Douglas Wille
(74) *Attorney, Agent, or Firm*—Renner, Otto, Boisselle & Sklar, LLP

(57) ABSTRACT

In one embodiment, a process for fabricating a high-K layer comprising the steps of: placing a semiconductor substrate into a first chamber of a deposition apparatus; supplying high-K precursors to the deposition apparatus; generating ions or molecules of high-K material from the high-K precursors in a second chamber of the deposition apparatus, the second chamber being remote from the first chamber; passing the ions or molecules of high-K material from the second chamber to the first chamber; and depositing a high-K layer upon the semiconductor substrate.

18 Claims, 2 Drawing Sheets

METHODS FOR THE DEPOSITION OF HIGH-K FILMS AND HIGH-K FILMS PRODUCED THEREBY

FIELD OF THE INVENTION

The present invention relates to methods by which to deposit high-K films, and more particularly to semiconductor devices which incorporate therein a high-K layer.

BACKGROUND OF THE INVENTION

A continuing trend in semiconductor technology is to build integrated circuits with more and/or faster semiconductor devices. The drive toward this ultra large-scale integration (ULSI) has resulted in continued shrinking of devices and circuit features. As the devices and features shrink, new problems are discovered that require new methods of fabrication and/or new arrangements.

One such problem associated with semiconductor devices which incorporate therein one or more high-K layers is carbon contamination due to the use of organic precursors to form high-K layers. For example, a high-K layer of hafnium oxide can be deposited using the following method. Hafnium is supplied in the form of a hafnium-containing vapor or gas such as hafnium tetra-t-butoxide and the oxygen is supplied in the gaseous form. In this method, the hafnium tetra-t-butoxide and oxygen gas are supplied to an appropriate CVD apparatus to form a layer of hafnium oxide having a desired thickness.

During the process of forming a hafnium oxide layer carbon from the remaining portion of the hafnium-containing vapor or gas (hafnium tetra-t-butoxide) can contaminate the hafnium oxide layer. One unwanted side effect of such contamination is that the carbon contamination has to be removed by oxidation to ensure a reliable high-K film is produced. The oxidation process to remove the carbon contaminates in the high-K layer also results in a high-K layer with an increased thickness compared with the thickness of a corresponding standard-K layer, and an increased equivalent oxide thickness (EOT).

Hence, there is a need in the art for a method which permits the growth of high-K layers without the need for an oxidation step to remove carbon contaminates therefrom.

SUMMARY OF THE INVENTION

In one embodiment, the present invention relates to a process for fabricating a high-K layer comprising the steps of: placing a semiconductor substrate into a first chamber of a deposition apparatus; supplying high-K precursors to the deposition apparatus; generating ions or molecules of high-K material from the high-K precursors in a second chamber of the deposition apparatus, the second chamber being remote from the first chamber; passing the ions or molecules of high-K material from the second chamber to the first chamber; and depositing a high-K layer upon the semiconductor substrate.

In another embodiment, the present invention relates to a process for fabricating a semiconductor device which contains a high-K layer comprising the steps of: placing a semiconductor substrate into a first chamber of a deposition apparatus; supplying high-K precursors to the deposition apparatus; generating ions or molecules of high-K material from the high-K precursors in a second chamber of the deposition apparatus, the second chamber being remote from the first chamber; passing the ions or molecules of high-K material from the second chamber to the first chamber; depositing a high-K layer upon the semiconductor substrate; and subjecting the semiconductor substrate to further process steps in order to yield a semiconductor device.

In another embodiment, the present invention relates to a process for fabricating a layer in a semiconductor device comprising the steps of: placing a semiconductor substrate into a first chamber of a deposition apparatus; supplying layer forming precursors to the deposition apparatus; generating ions or molecules of the layer forming precursors in a second chamber of the deposition apparatus, the second chamber being remote from the first chamber; passing the ions or molecules of the layer forming precursors from the second chamber to the first chamber; and depositing a layer upon the semiconductor substrate.

In one embodiment, the previously mentioned layer in a semiconductor device deposited via the present invention comprises at least one compound selected from silicon, silicon oxide, silicon dioxide, silicon oxynitride, silicon nitride, silicon germanium, or mixtures thereof In another embodiment, the previously mentioned layer in a semiconductor device deposited via the present invention layer comprises at least one metal or metal containing compound selected from copper, gold, silver, aluminum, tungsten, tantalum, molybdenum, cobalt, nickel, titanium, ruthenium, rhodium, platinum, palladium, metal oxides thereof, metal nitrides thereof, alloys thereof, or mixtures of two or more thereof.

In yet another embodiment, a method according to the present invention can be utilized to co-deposited a layer of a semiconductor device with one or more dopants. Such dopants include, but are not limited to, nitrogen, oxygen, germanium, silicon germanium, phosphorus or arsenic.

Thus, the present invention overcomes the problems associated with carbon contamination of high-K layers via the use of molecular deposition. Additionally, the present invention also permits the control of metal to oxygen ratios, if applicable, in high-K materials.

DETAILED DESCRIPTION

Figure 1:
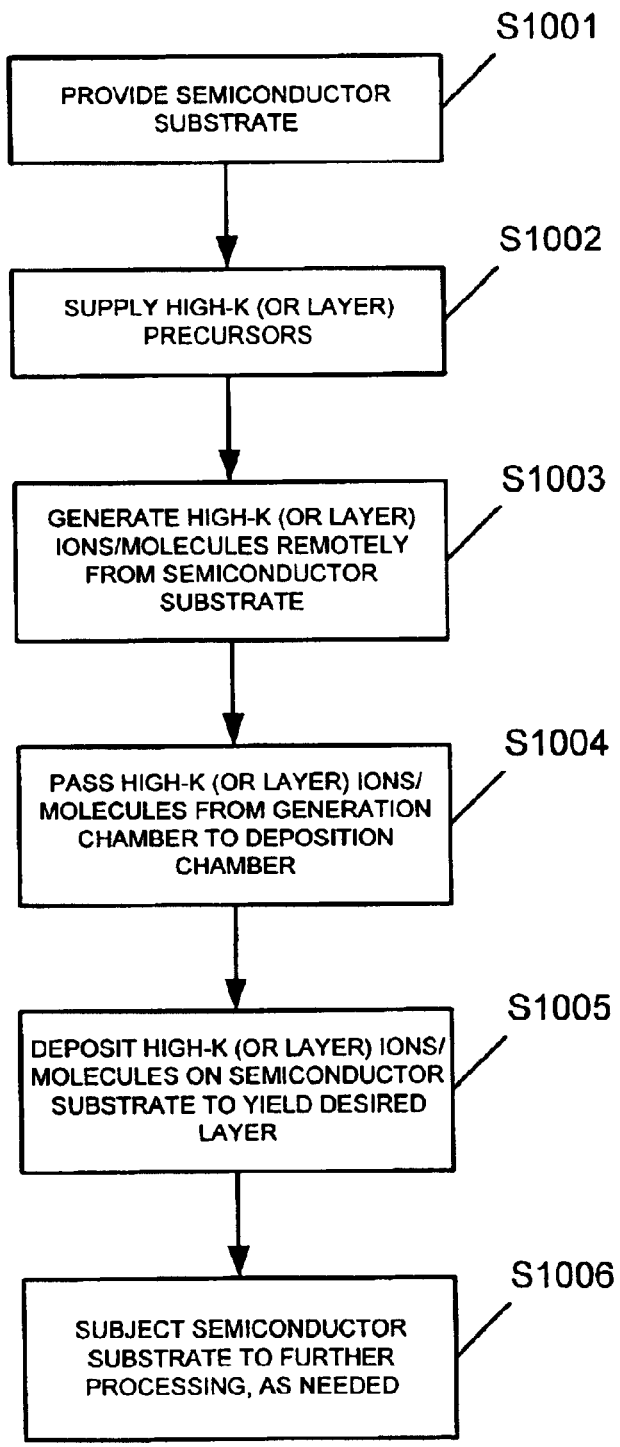
FIG. 1 is a schematic flow diagram showing the basic steps in a process of depositing a high-K layer in accordance with the present invention.

As used herein, a "high-K material" or a "high-K dielectric material" refers to a material, or stack of materials, having a relative permittivity in one embodiment of about ten (10) or more, and in another embodiment of about twenty (20) or more. Relative permittivity is the ratio of the absolute permittivity ($\epsilon$) found by measuring capacitance of the material to the permittivity of free space ($\epsilon_o$), that is $K=\epsilon/\epsilon_o$. High-K materials will be described in greater detail below. Although any high-K material can be deposited according to the method of the present invention, hafnium oxide (e.g., $HfO_2$), zirconium oxide (e.g., $ZrO_2$), cerium oxide (e.g., $CeO_2$), aluminum oxide (e.g., $Al_2O_3$), titanium oxide (e.g., $TiO_2$), yttrium oxide (e.g., $Y_2O_3$) and barium strontium titanate (BST) are examples of suitable materials for the formation of high-K layers in semiconductor devices. In addition, all binary and ternary metal oxides and ferroelectric materials having a K higher than, in one embodiment, about twenty (20) can be used in the present invention.

As used herein, the term "standard-K dielectric material" or "standard-K dielectric material" refers to a dielectric material having a relative permittivity, or K, of up to about ten (10). Example standard-K materials include, for example, silicon dioxide (K of about 3.9), silicon oxynitride (K of about 4 to 8 depending on the relative content of oxygen and nitrogen) and silicon nitride (K of about 6 to 9).

Approximate K-values or, in some cases, a range of K-values, are shown below in Table 1 for several exemplary dielectric materials. It is understood that the present invention is not limited to the specific dielectric materials disclosed herein, but may include any appropriate standard-K and high-K dielectric materials which are known and are compatible with the remaining elements of the semiconductor device with which the dielectric materials are to be used.

TABLE I

| Dielectric Material | Approximate Relative Permittivity (K) |
|---|---|
| aluminum oxide ($Al_2O_3$) | 9–10 |
| zirconium silicate | 12 |
| hafnium silicate | 15 |
| hafnium silicon oxynitride | 16 |
| hafnium silicon nitride | 18 |
| lanthanum oxide ($La_2O_3$) | 20–30 |
| hafnium oxide ($HfO_2$) | 40 |
| zirconium oxide ($ZrO_2$) | 25 |
| cerium oxide ($CeO_2$) | 26 |
| bismuth silicon oxide ($Bi_4Si_2O_{12}$) | 35–75 |
| titanium dioxide ($TiO_2$) | 30 |
| tantalum oxide ($Ta_2O_5$) | 26 |
| tungsten oxide ($WO_3$) | 42 |
| yttrium oxide ($Y_2O_3$) | 20 |
| lanthanum aluminum oxide ($LaAlO_3$) | 25 |
| barium strontium titanate ($Ba_{1-x}Sr_xTiO_3$) | ~20—~200 |
| barium strontium oxide ($Ba_{1-x}Sr_xO_3$) | ~20—~200 |
| $PbTiO_3$ | ~20—~200 |
| barium titanate ($BaTiO_3$) | ~20—~200 |
| strontium titanate ($SrTiO_3$) | ~20—~200 |
| $PbZrO_3$ | ~20—~200 |
| PST ($PbSc_xTa_{1-x}O_3$) | 3000 |
| PZN ($PbZn_xNb_{1-x}O_3$) | ~500—5000 |
| PZT ($PbZr_xTi_{1-x}O_3$) | ~150—1000 |
| PMN ($PbMg_xNb_{1-x}O_3$) | ~500—5000 |

It is noted that the K-values, or relative permittivity, for both standard-K and high-K dielectric materials may vary to some degree depending on the exact nature of the dielectric material and on the process used to deposit the material. Thus, for example, differences in purity, crystallinity and stoichiometry, may give rise to variations in the exact K-value determined for any particular dielectric material.

As used herein, when a material is referred to by a specific chemical name or formula, the material may include non-stoichiometric variations of the stoichiometrically exact formula identified by the chemical name. For example, tantalum oxide, when stoichiometrically exact, has the chemical formula $Ta_2O_5$. As used herein, the term "tantalum oxide" may include variants of stoichiometric $Ta_2O_5$, which may be referred to as $Ta_xO_y$, in which either of x or y vary by a small amount. For example, in one embodiment, x may vary from about 1.5 to 2.5, and y may vary from about 4.5 to about 5.5. In another embodiment, x may vary from about 1.75 to 2.25, and y may vary from about 4 to about 6. Such variations from the exact stoichiometric formula fall within the definition of tantalum oxide. Similar variations from exact stoichiometry are included when the chemical formula for a compound is used. For example, again using tantalum oxide as an example, when the formula $Ta_2O_5$ is used, $Ta_xO_y$ as defined above, is included within the meaning. Thus, in the present disclosure, exact stoichiometry is intended only when such is explicitly so stated. As will be understood by those of skill in the art, such variations may occur naturally, or may be sought and controlled by selection and control of the conditions under which materials are formed.

Here and in all numerical values in the specification and claims, the limits of the ranges and ratios may be combined.

Semiconductor Devices

The process of the present invention is described herein below in terms of a depositing a high-K layer on a silicon substrate. It should be noted however, that the process of the present invention can be applied to any device in which one or more high-K layers are desired.

As shown in FIG. 1, the present invention relates to a process of forming a high-K layer by generating the high-K ions/molecules which will combine to form the high-K layer in a area remote from the area where the deposition surface upon which the high-K layer is to be deposited resides. The following discussion will use the deposition of a hafnium oxide high-K layer as an example. However, the present invention applies equally to all high-K materials and is not limited to only the deposition of hafnium oxide layers.

Figure 2A:
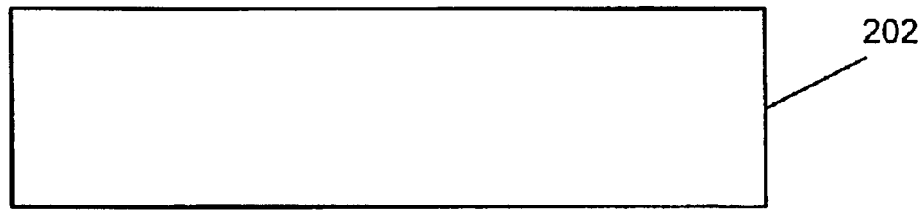
FIGS. 2A and 2B are a schematic cross-sectional view of a semiconductor substrate which has had a high-K layer formed thereon in accordance with the present invention.

In the first step of the method of the present invention, shown in FIG. 1 as Step S1001, a semiconductor substrate 202 is provided, as is shown in FIG. 2A. The semiconductor substrate may be any appropriately selected semiconductor substrate known in the art.

In one embodiment, the semiconductor substrate is a bulk silicon substrate. In one embodiment, the semiconductor substrate is a silicon-on-insulator semiconductor substrate. In another embodiment, the semiconductor substrate is a p-doped silicon substrate. Suitable semiconductor substrates include, for example, bulk silicon semiconductor substrates, silicon-on-insulator (SOI) semiconductor substrates, silicon-on-sapphire (SOS) semiconductor substrates, and semiconductor substrates formed of other materials known in the art.

It should be noted, the present invention is not limited to any particular type of semiconductor substrate. Rather, as was mentioned above, the present invention is applicable to any semiconductor device which contains therein at least one high-K layer. The semiconductor substrate 202 utilized in the present invention may already contain numerous layers and/or devices prior to the deposition of one or more high-K layers in accordance with the present invention.

In the second step of the method of the present invention, shown in FIG. 1 as Step S1002, the appropriate high-K precursors are supplied to a molecular deposition instrument. For example, the instrument could be a remote plasma deposition system, a molecular beam relaxation system capable of velocity modulation of neutral molecular beams, or UHV system capable of ultra slow multi-charged ion deposition. Such systems are known to those skilled in the art, and as such a discussion hereof is omitted. In the present example, the precursors are gaseous or vaporous hafnium tetra-t-butoxide (the hafnium source) and oxygen gas.

In one embodiment, the amount of each precursor is controlled so as to yield the desired metal to oxygen ratio. In another embodiment, the amount of each precursor supplied to the deposition instrument is not critical. In yet another embodiment, each precursor is supplied at a rate of about 0.001 to about 10 standard liters per minute (slpm). In yet another embodiment, the precursors, where applicable, can be supplied in a solid state.

In the third step of the method of the present invention, shown in FIG. 1 as Step S1003, the appropriate high-K precursors are subjected to the appropriate conditions to generate ions and/or molecules of the high-K material. In one embodiment, this is accomplished by subjecting the high-K precursors to a temperature in the range of about 25° C. to about 600° C., or about 50° C. to about 500° C., or even about 100° C. to about 400° C. In one embodiment, the ions and/or molecules of the high-K material are generated in a chamber other than the chamber in which the semiconductor substrate 202 resides. Due in part to this, the present invention prevents a significant portion and/or all of the carbon-containing by-products formed from the generation of the high-K ions/molecules from reaching the semiconductor substrate 202. Thus, contamination of the high-K layer due to such carbon-containing by-products is greatly reduced and/or eliminated. This then eliminates the need for subjecting the high-K layer to oxidation to remove the carbon-containing by-products.

In the fourth step of the method of the present invention, shown in FIG. 1 as Step S1004, the appropriate high-K ions/molecules are passed from the chamber in which they are generated to the deposition chamber in which the semiconductor substrate 202 resides.

Figure 2B:
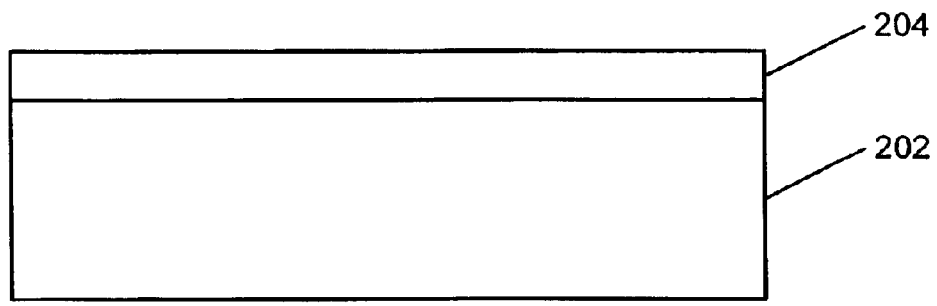

In the fifth step of the method of the present invention, shown in FIG. 1 as Step S1005, the appropriate high-K ions/molecules are deposited on the surface of the semiconductor substrate 202 to form a layer of high-K material 204 (FIG. 2B) having a suitable thickness. The thickness of the high-K layer 204 can be any desired thickness. In practice, the thickness of the high-K layer 204 depends upon the application for which the semiconductor device, formed from semiconductor substrate 202, is to be used.

In one embodiment, the thickness of the high-K layer 204 is from about 15 Angstroms to about 200 Angstroms, or from about 25 Angstroms to about 175 Angstroms, or even from about 50 Angstroms to about 150 Angstroms.

In one embodiment, the appropriate high-K ions/molecules are deposited to form a high-K layer at a rate of about 5 Angstroms per minute to about 30 Angstroms per minute, or from about 7.5 Angstroms per minute to about 25 Angstroms per minute, or even from about 10 Angstroms per minute to about 20 Angstroms per minute.

In another embodiment, the deposition rate of the high-K layer is controlled and is considered to be formed by slow molecular deposition (i.e., at a rate of less than about 5 Angstroms per minute). In still another embodiment, the rate of deposition for the high-K layer is controlled to a greater extent and is considered to be formed by ultra-slow molecular deposition (i.e., at a rate of less than about 1 Angstrom per minute).

In another embodiment, the present invention permits co-deposition of materials to form hybrid layers. For example, the above technique could be utilized to deposit a silicon dioxide layer in conjunction with nitrogen to obtain a nitridated silicon dioxide layer. This can be accomplished using silane gas, SiH4, oxygen gas and nitrogen gas.

Alternatively, the present invention could also be utilized to deposit a silicon nitride layer as a stand alone gate dielectric or as interfacial layer in conjunction with metal oxide deposition to modulate the bulk or interfacial properties of the dielectric and enhance gate metal oxide high-K dielectric mobility. Other layers which could be deposited using a method according to the present invention include an aluminum oxide layer in metal oxide high-K stacks to inhibit metal ion diffusion into the substrate and relief of interfacial strain.

Yet another alternative use for the present invention involves the deposition of metallic species which are deposited over an oxide or high-K dielectric for metal gate integration.

In the sixth step of the method of the present invention, shown in FIG. 1 as Step S1006 the semiconductor substrate 202 having high-K layer 204 thereon is subjected to additional processing steps in order to form the desired semiconductor device.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

What is claimed is:

1. A process for fabricating a high-K layer comprising the steps of:
    placing a semiconductor substrate into a first chamber of a deposition apparatus:
    supplying high-K precursors to the deposition apparatus;
    generating ions or molecules of high-K material from the high-K precursors in a second chamber of the deposition apparatus, the second chamber being remote from the first chamber;
    passing the ions or molecules of high-K material from the second chamber to the first chamber; and
    depositing a high-K layer upon the semiconductor,
    wherein the high-K ions or molecules are deposited to form the high-K layer at a rate of less than about 5 Angstroms per minute.

2. The process of claim 1, wherein the high-K layer has a K of at least about 10.

3. The process of claim 1, wherein the high-K layer has a K of at least about 20.

4. The process of claim 1, wherein the high-K layer comprises at least one of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate ($Ba_{1-x}Sr_xTiO_3$) barium strontium oxide ($Ba_{1-x}Sr_xO_3$), $PbTiO_3$, barium titanate, strontium titanate, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$).

5. The process of claim 1, wherein the high-K layer has a thickness in the range of about 15 Angstroms to about 200 Angstroms.

6. The process of claim 1, wherein the high-K ions or molecules are deposited to form the high-K layer at a rate of less than about 1 Angstroms per minute.

7. A process for fabricating a semiconductor device which contains a high-K layer comprising the steps of:
    placing a semiconductor substrate into a first chamber of a deposition apparatus;
    supplying high-K precursors to the deposition apparatus;
    generating ions or molecules of high-K material from the high-K precursors in a second chamber of the deposition apparatus, the second chamber being remote from the first chamber;
    passing the ions or molecules of high-K material from the second chamber to the first chamber;

depositing a high-K layer upon the semiconductor substrate; and subjecting the semiconductor substrate to further process steps in order to yield a semiconductor device, wherein the high-K ions or molecules are deposited to form the high-K layer at a rate of less than about 5 Angstroms per minute.

8. The process of claim 7, wherein the high-K layer has a K of at least about 10.

9. The process of claim 7, wherein the high-K layer has a K of at least about 20.

10. The process of claim 7, wherein the high-K layer comprises at least one of aluminum oxide, zirconium silicate, hafnium silicate, hafnium silicon oxynitride, hafnium silicon nitride, lanthanum oxide, hafnium oxide, zirconium oxide, cerium oxide, bismuth silicon oxide, titanium dioxide, tantalum oxide, tungsten oxide, yttrium oxide, lanthanum aluminum oxide, barium strontium titanate ($Ba_{1-x}Sr_xTiO_3$) barium strontium oxide ($Ba_{1-x}Sr_xO_3$), $PbTiO_3$, barium titanate, strontium titanate, $PbZrO_3$, PST ($PbSc_xTa_{1-x}O_3$), PZN ($PbZn_xNb_{1-x}O_3$), PZT ($PbZr_xTi_{1-x}O_3$), PMN ($PbMg_xNb_{1-x}O_3$).

11. The process of claim 7, wherein the high-K layer has a thickness in the range of about 15 Angstroms to about 200 Angstroms.

12. The process of claim 7, wherein the high-K ions or molecules are deposited to form the high-K layer at a rate of less than about 1 Angstroms per minute.

13. A process for fabricating a layer in a semiconductor device comprising the steps of:

placing a semiconductor substrate into a first chamber of a deposition apparatus;

supplying layer forming precursors to the deposition apparatus;

generating ions or molecules of the layer forming precursors in a second chamber of the deposition apparatus, the second chamber being remote from the first chamber;

passing the ions or molecules of the layer forming precursors from the second chamber to the first chamber; and depositing a layer upon the semiconductor substrate, wherein the ions or molecules are deposited to form the layer at a rate of less than about 5 Angstroms per minute.

14. The process of claim 13, wherein the layer deposited upon the semiconductor substrate is a dielectric layer.

15. The process of claim 14, wherein layer has a K of less than about 10.

16. The process of claim 13, wherein the layer comprises at least one compound selected from silicon, silicon oxide, silicon dioxide, silicon oxynitride, silicon nitride, silicon germanium, or mixtures thereof.

17. The process of claim 13, wherein the layer comprises at least one metal or metal containing compound selected from copper, gold, silver, aluminum, tungsten, tantalum, molybdenum, cobalt, nickel, titanium, ruthenium, rhodium, platinum, palladium, metal oxides thereof, metal nitrides thereof, alloys thereof, or mixtures of two or more thereof.

18. The process of claim 13, wherein the layer is co-deposited with one or more dopants selected from nitrogen, oxygen, germanium, silicon germanium, phosphorus or arsenic.

* * * * *

UNITED STATES PATENT AND TRADEMARK OFFICE
CERTIFICATE OF CORRECTION

PATENT NO. : 6,800,568 B1
DATED : October 5, 2004
INVENTOR(S) : Ibok

It is certified that error appears in the above-identified patent and that said Letters Patent is hereby corrected as shown below:

Column 2,
Line 22, replace "thereof In" with -- thereof. In --

Column 6,
Line 23, replace "apparatus:" with -- apparatus; --

Signed and Sealed this

First Day of February, 2005

JON W. DUDAS
*Director of the United States Patent and Trademark Office*